United States Patent [19]

Crowley

[11] Patent Number: 4,468,632

[45] Date of Patent: Aug. 28, 1984

[54] PHASE LOCKED LOOP FREQUENCY SYNTHESIZER INCLUDING FRACTIONAL DIGITAL FREQUENCY DIVIDER

[75] Inventor: Albert T. Crowley, Somerdale, N.J.

[73] Assignee: RCA Corporation, New York, N.Y.

[21] Appl. No.: 326,152

[22] Filed: Nov. 30, 1981

[51] Int. Cl.³ .............................................. H03L 7/18
[52] U.S. Cl. ...................................... 331/14; 331/17; 331/25
[58] Field of Search ...................... 331/17, 14, 25, 1 A

[56] References Cited

U.S. PATENT DOCUMENTS

| | | | |
|---|---|---|---|
| 3,353,104 | 11/1967 | Loposer | 377/48 |
| 3,516,007 | 6/1970 | Bos et al. | 331/18 |
| 3,729,688 | 4/1973 | Cerney, Jr. et al. | 331/1 A |
| 3,872,397 | 3/1975 | Hanneman | 331/1 A |
| 3,928,813 | 12/1975 | Kingsford-Smith | 331/1 A |
| 3,943,460 | 3/1976 | Arai | 331/16 |
| 3,959,737 | 5/1976 | Tanis | 331/1 A |
| 4,145,667 | 3/1979 | Messerschmitt | 331/16 |
| 4,179,670 | 12/1979 | Kingsbury | 331/10 |
| 4,204,174 | 5/1980 | King | 331/10 |
| 4,290,028 | 9/1981 | LeGrand | 331/1 A |
| 4,333,060 | 6/1982 | Mosley, Jr. et al. | 331/1 A |

OTHER PUBLICATIONS

Yeung, Steve, "Developments in Phase Locked Loop Tuning Systems", New Electronics, vol. 12, No. 3, (Feb. 6, 1979), pp. 64–67.

Primary Examiner—Siegfried H. Grimm
Assistant Examiner—David C. Mis
Attorney, Agent, or Firm—J. S. Tripoli; R. L. Troike; D. W. Phillion

[57] ABSTRACT

An improvement in a frequency synthesizer comprising a voltage-controlled oscillator (VCO) for generating an output signal $S_{VCO}$ of frequency $F_{VCO}$, a divider for dividing $F_{VCO}$ in division cycles with each division cycle consisting of the division of $F_{VCO}$ by N, Y times, and by (N+M), Z times, in an iterative manner to produce a divided output signal $S_N$ of frequency $F_N$, where the division ratio is $$N + \frac{Z}{Y+Z} M$$

and where N, Y, M and Z are integers, a reference signal generator for generating a reference signal $S_R$ of frequency $F_R$, and a phase detector responsive to $S_N$ and $S_R$ to produce an output signal whose amplitude is representative of the phase therebetween. The improvement is a control circuit comprising logic for detecting and averaging the output signal from the phase detector during each division of $F_{VCO}$ in each division cycle to produce a d.c. control signal whose amplitude is substantially constant and proportional to the average of the amplitudes of the detected output signals over each division cycles. The VCO is responsive to the d.c. control signal to generate an output signal $S_{VCO}$ whose divided frequency $F_N = F_R$.

7 Claims, 7 Drawing Figures

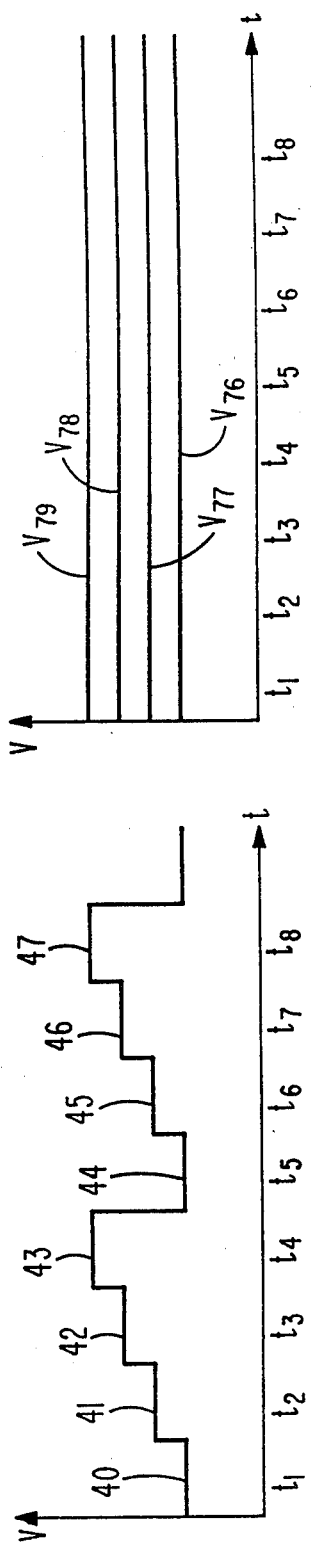
Fig. 5
Fig. 6
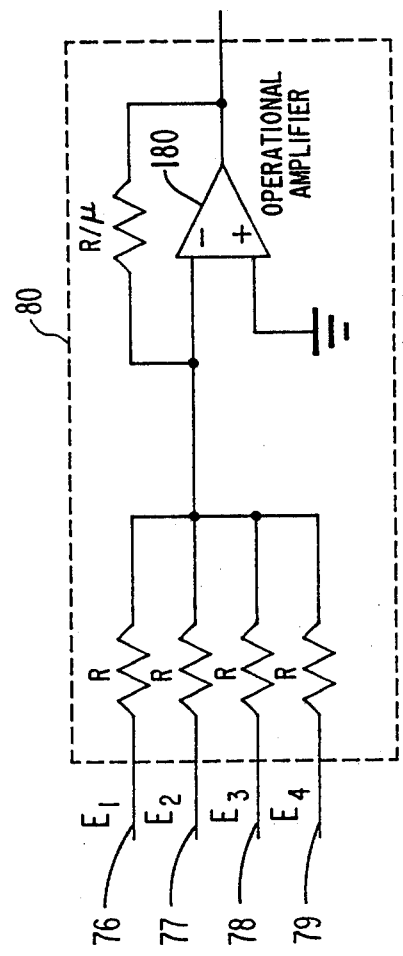
Fig. 7

PHASE LOCKED LOOP FREQUENCY SYNTHESIZER INCLUDING FRACTIONAL DIGITAL FREQUENCY DIVIDER

This invention relates generally to frequency synthesizers and more particularly to an improved frequency synthesizer including a fractional digital frequency divider.

The simplest digital frequency synthesizer implementation is the so-called "divide-by-N synthesizer" which consists of a single phase-locked loop. More specifically, the loop consists of a voltage controlled oscillator (VCO) whose output is supplied to a divide-by-N counter whose output, in turn, is supplied to one input of a phase detector. A reference signal of a given frequency is supplied to the other input of the phase detector whose output is then supplied back through a loop filter to the frequency control input of the VCO. By changing the value of N, which is an integer, the frequency of the VCO will also change. However, the smallest frequency increment of the VCO must be equal to the frequency of the reference signal since N is always an integer. To obtain smaller frequency increments in the VCO output, there has been developed in the prior art a fractional frequency divider wherein the output of the VCO can, for example, be divided by N three times and then by (N+1) one time, with this division cycle being iteratively repeated. The average of such a division cycle is $(4N+1)/4 = N + \frac{1}{4}$. Thus, if the reference signal has a frequency of 4 MHz and N is equal to 25, the output of the VCO will be 4 MHz times $25\frac{1}{4}$ or 101 MHz. With such a system, however, the error voltage supplied from the phase detector and presented to the VCO will have a stepped sawtooth characteristic because of the divide-by-N functions and the change in the divider from N to (N+1) every fourth division. Such a stepped sawtooth waveform will result in undesirable phase modulation of the output signal of the VCO. To compensate for such undesirable phase modulation, the prior art teaches a digital accumulator which is employed to keep track of the phase error. A number is entered into accumulator which corresponds to the desired fractional part of the division ratio. This number is continuously added to itself in the accumulator. When an overflow occurs, the division ratio of the divide-by-N divider is increased by one for one division cycle. The accumulation in the accumulator after each division cycle is converted to an analog signal by a digital-to-analog converter (DAC) and subtracted from the output of the phase detector to compensate for the stepped sawtooth characteristic of said phase detector output, resulting in a somewhat smoother correcting d.c. voltage being supplied to the VCO. However, since the accumulator and DAC operates substantially independently of the phase detector, the output from the DAC is sometimes not well synchronized with the output from the phase detector nor does it always generate the precise amplitude necessary to cancel the stepped output from the phase detector so that some distortion in the VCO control signal remains. The above stated prior art is generally disclosed in U.S. Pat. No. 4,179,670 to Kingsbury.

The present invention provides a signal processing circuit which alters the stepped output from the phase detector to produce a d.c. voltage of constant amplitude which is supplied to the VCO to thereby eliminate fluctuations in the output frequency of the VCO.

In accordance with a preferred embodiment of the invention, there is provided, in a frequency synthesizer including a fractional frequency divider comprising a voltage-controlled oscillator (VCO) for generating an output signal $S_{VCO}$ and having a frequency $F_{VCO}$, a divider for the division of $F_{VCO}$ by division cycles with each division cycle consisting of the division of $F_{VCO}$ by N, Y times, and then the division of $F_{VCO}$ by (N+1), Z times, in an iterative manner to produce a fractionally divided output signal $S_N$ of frequency $F_N$, where $F_N$ equals $F_{VCO}$ divided by $$\left(N + \frac{Z}{Y+Z}\right),$$

where N and Y and Z are integers, a generator for generating a reference signal $S_R$ having a frequency $F_R$, and a phase detector responsive to $S_N$ and $S_R$ to produce an output signal whose output is representative of the phase therebetween, an improvement consisting of logic for detecting and averaging the output signals supplied by the phase detector during each division cycle to produce a d.c. control signal whose amplitude is substantially constant and proportional to the average of the amplitudes of the detected output signals over each division cycle. The VCO is responsive to the d.c. control signal to generate an output signal $S_{VCO}$ whose divided frequency $F_N = F_R$.

In the drawings:

FIGS. 5 and 6 show detailed timing waveforms; and

FIG. 7 is a detailed diagram of a portion (the summer 80) of FIG. 2,

Figure 1:
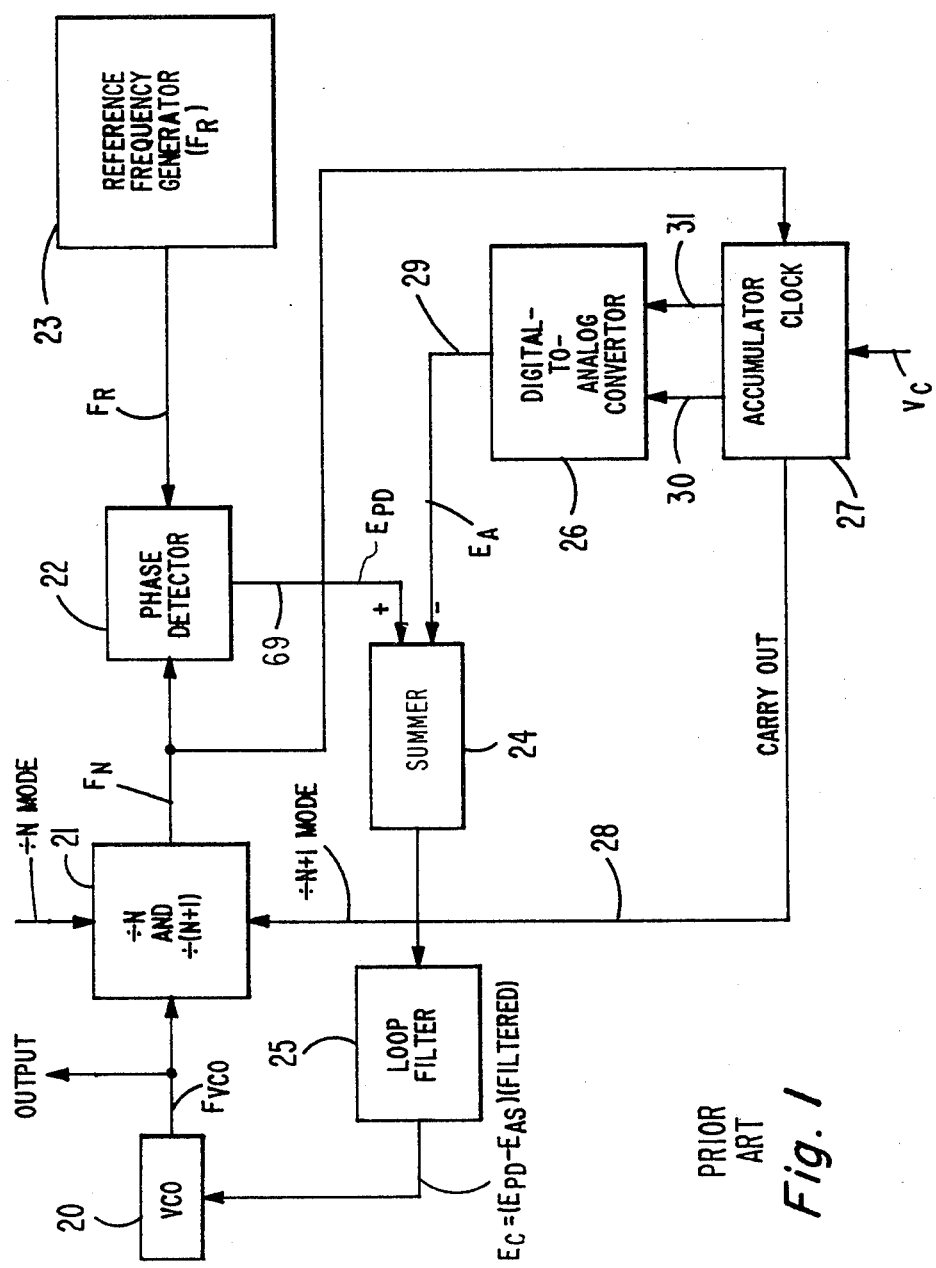
FIG. 1 is a block diagram of a prior art frequency synthesizer including a fractional frequency divider.

The system of FIG. 1, as indicated above, is prior art and is included in this specification only to provide a background for the discussion of the present invention. A brief discussion of FIG. 1 follows.

The output signal of VCO 20 is supplied to a divider 21 which, as mentioned above, produces the fractional division of the output of VCO 20. Specifically, divider 21 divides in two modes, in one of which it divides by N and the other it divides by (N+1). Thus, for example, if N is made equal to 25, then (N+1) is equal to 26. If three divisions by N, or 25, are made of the output of VCO followed by one division of (N+1), or 26, then over a division cycle which consists of the three divisions by N and the one by (N+1), the total division is 4N+1 or 101. The division cycle as defined in the example being employed herein is thus equal to (4N+1) and consists of four divisions. Accordingly, a single division over a long period averages to be $(N+\frac{1}{4})$ or $25\frac{1}{4}$. Obviously with other values of N, the average division is different.

The output of divider 21 is supplied to one input of phase detector 22. The output $S_R$ of reference frequency generator 23 is supplied to the other input of phase detector 22 whose output $E_{PD}$ in turn is supplied to one input of summer 24. If it is assumed that the frequency of the reference signal $F_R$ is 4 MHz, then the output frequency $F_{VCO}$ of the VCO must be $25\frac{1}{4} \times 4$ MHz or 101 MHz to satisfy the requirement that $F_N = F_R$. Such frequency $F_{VCO}$ is established by the signal $E_{PD}$ appearing on output lead 69 of phase detector 22 and which then passes through summer 24 and loop filter 25 to the control input of VCO 20 as control signal $E_c$.

Figure 3:
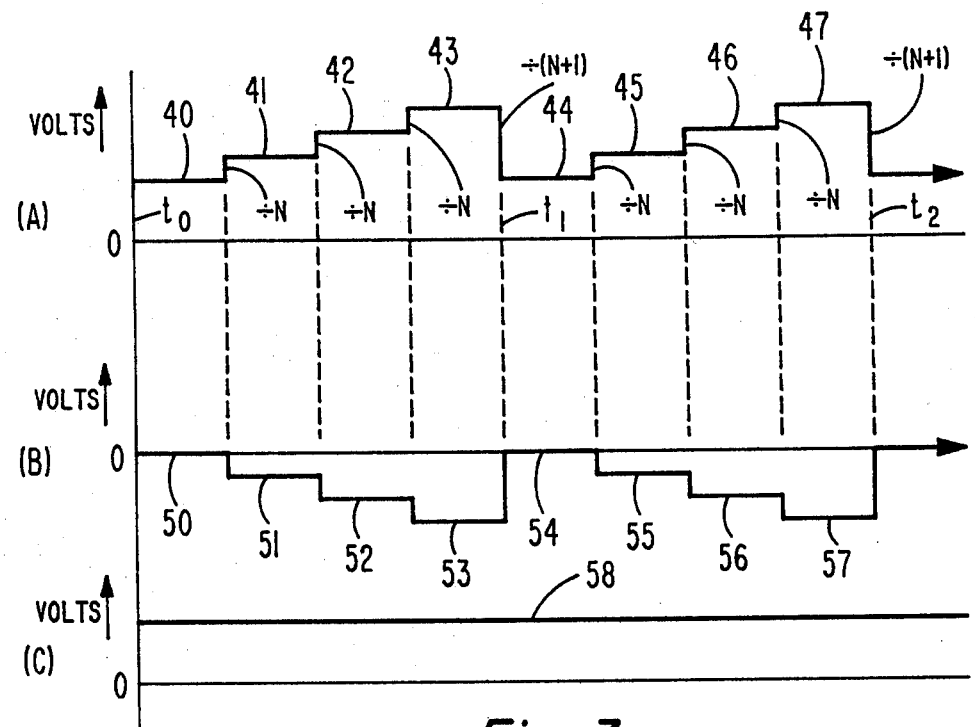
FIG. 3 is a set of waveforms employed in discussing both the prior art structure of FIG. 1 and the invention shown in FIG. 2.

Because of the frequency division of the output of VCO 20 by two different factors, namely, N and (N+1), the output of the phase detector 22 will be a stepped voltage as shown in waveform A of FIG. 3. More specifically, for each division cycle, there will be four steps as indicated by the group of four steps 40, 41, 42 and 43. A second division cycle is represented by steps 44, 45, 46 and 47. These steps occur through the following process. When the division by (N+1) occurs, as at time $t_1$, the phase of the signal at the output of the divider 21 (FIG. 1) is caused to undergo a sudden lag with respect to the phase of the output of the referency frequency generator 23 because the extra count in the division factor makes the period of $F_N$ slightly longer than the period of $F_R$. Then during each of the next three divisions by N, the period $F_N$ is slightly less than the period of $F_R$ so that the phase of $S_N$ advances with respect to the phase of $S_R$. As the phase advances during each division a slightly different output voltage is generated by phase detector 22 as a direct result of such changing phase relationship between the output $S_N$ of divider 21 and the output $S_R$ of reference signal generator 23. Then at time $t_2$, another division by (N+1) occurs and the cycle repeats.

Without proper compensation of the output of the phase detector 22, the stepped voltage of waveform A, for example in FIG. 3, which would be supplied back to the VCO 20 through summer 24 and filter 25, would produce undesirable perturbations in the frequency of the output of VCO 20.

In the prior art structure of FIG. 1, logic including accumulator 27 and digital-to-analog (DAC) converter 26 are provided to compensate for the stepped voltage of waveform A of FIG. 3. More specifically, accumulator 27 and DAC 26 are constructed to supply an output as shown in waveform B of FIG. 3 which is calculated to be equal and opposite to the stepped voltage which is shown in waveform A of FIG. 3. The output $E_A$ of DAC 26, shown in waveform B of FIG. 3 is supplied to the subtracting input of summer 24 via lead 29 so that the output of summer 24 will be the difference between waveform A and waveform B and will approximate a constant voltage as represented by the voltage 58 of waveform C of FIG. 3. If the circuit of FIG. 1 performed perfectly the voltage 58 would be free of the variations which cause perturbations in the output of VCO 20. Perturbations will occur, however, as discussed below.

In operation, accumulator 27 is supplied with a given constant digital value $V_c$ which is added to itself every division of the output of VCO. After four such accumulations, the accumulator 27 overflows and supplies a carry-out signal on lead 28 which is supplied to divider 21 and changes the divisor to (N+1) from N. After division by the value (N+1), the divider 21 resumes division by N for three divisions as discussed above.

The value accumulated in accumulator 27 is converted to an analog signal in DAC 26 to produce the waveform C of FIG. 3 as discussed above. However, it can be seen that in the prior art structure of FIG. 1, the amplitude values of the output of DAC 26 are not derived directly from the output of phase detector 22 and therefore, must be estimated. Furthermore, the timing delays in the operation of accumulator 27, DAC 26, and phase detector 22 are not precisely known so that the transitions occurring in waveforms A and B of FIG. 3 might not be in exact alignment. The net result of the use of the accumulator 27 and the DAC 26 to compensate for the stepped output of phase detector 22 does not, in many cases, sufficiently eliminate the perturbations in the output of VCO 20 caused by the fractional division function.

Figure 2:
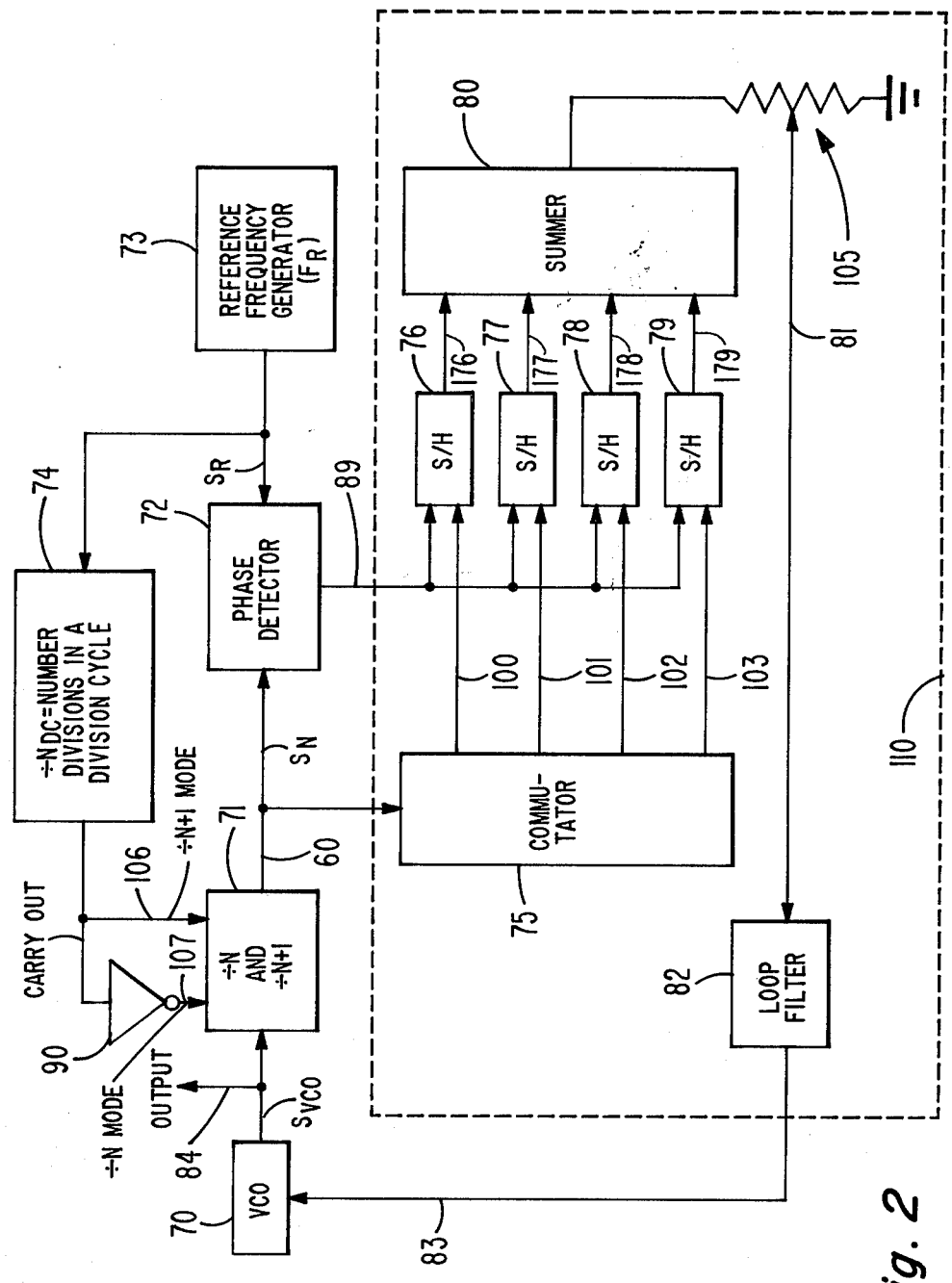
FIG. 2 is a block diagram of the invention.

Referring now to FIG. 2, which shows the present invention, there is shown a VCO 70, a divider 71, a phase detector 72, and a reference frequency generator 73 which corresponds to and operates in the same manner as the VCO 20, the divider 21, the phase detector 22, and the reference frequency generator 23, respectively, of the prior art structure of FIG. 1, with the major exception that the control voltage supplied to VCO 70 via lead 83 in FIG. 2 is a d.c. voltage substantially free of any a.c. component which would produce perturbations in the output of VCO 70.

In FIG. 2, the output of phase detector 72, in response to the signals $S_N$ and $S_R$ being supplied thereto, is supplied in parallel to four sample and hold circuits 76, 77, 78 and 79. These four sample and hold circuits 76-79 are enabled successively and cyclically by four output signals generated by commutator 75. Such enabling output signals appear on the four output leads 100, 101, 102, and 103 of commutator 75 in the order mentioned and in response to each cycle of $S_N$ appearing on the output terminal 60 of divider 71. Thus, each of the sample and hold circuits 76-79 will sample the output of phase detector 72 during one division of the four divisions in each division cycle. In the example employed herein a divide-by-N occurs three times and a divide-by-(N+1) occurs once in each division cycle. If the N division were repeated five times and the (N+1) division one time, then the division cycle would consist of six divisions and six sample and hold circuits would be required rather than four. The commutator 75 would then have six outputs.

The summer 80 in essence functions to add together the voltages contained in each of the sample and hold circuits 76-79 for each division cycle and to then output a d.c. output on lead 81 which is the average of such voltage values. Such d.c. output voltage from summer 80 is updated with the samplings in the sample and hold circuits 76-79 in each subsequent division cycle. Thus, summer 80 acts as an averaging circuit for the samplings of each division cycle. Proper voltage scaling of the output of summer 80 can be accomplished by means of voltage divider 105.

The output signal from summer 80 is supplied to loop filter 82 and then to VCO 70 via lead 83 to control the frequency of the output of VCO 70 so that the output frequency $F_N$ of divider 71 is equal to the frequency $F_R$ of the reference signal $S_R$.

The mode of division of divider 71 (either $\div N$ or $\div (N+1)$) is controlled by output signals from divider 74 which divides by a number $N_{DC}$ equal to the number of divisions in a division cycle. Thus, in the example being employed herein, $N_{DC}$ is equal to four so that on every count of four the divide by (N+1) mode will be effected by a signal supplied to divider 74 via lead 106. During the other three counts of divider 74, the divide-by-N mode will be effected by a signal supplied through inverter 90 and lead 107.

If the desired fractional part of the division ratio is ½, then counter 74 will cause divider 71 to divide by N twice and then divide by (N+1) twice. If the desired fractional part is ¾, then counter 74 will cause divider 71 to divide by N once and then divide by (N+1) three times. If the fractional part is zero, then divider 71 will only divide by N and never by (N+1).

In the absence of the corrective means supplied by dashed block 110, the output of phase detector 72, which is the step voltage waveform shown in waveform A of FIG. 3, will cause the perturbations in the output frequency of VCO 70 as discussed above re VCO 20 of FIG. 1. However, in the structure of FIG. 2, the control circuitry within dashed blocked 110, which constitutes the essence of the present invention, functions to change the step waveform of waveform A of FIG. 3 to the constant d.c. voltage 58 shown in waveform C of FIG. 3.

The foregoing can be understood better with the aid of the waveforms of FIGS. 5 and 6. FIG. 5 shows the output voltage of phase detector 72 of FIG. 2 and FIG. 6 shows the output voltages of sample and hold (S/H) circuits 76, 77, 78 and 79 of FIG. 2. These output are designated $V_{76}$, $V_{77}$, $V_{78}$ and $V_{79}$, respectively. S/H circuit 76 samples the waveform of FIG. 5 at times $t_1$, $t_5$, etc. Since the phase detector output at these times is substantially equal, the output voltage of S/H circuit 76 will be the constant d.c. value $V_{76}$, S/H circuit 77 samples at time $t_2$, $t_6$, etc. producing output voltage $V_{77}$. Similar action by S/H circuits 78 and 79 produce output voltages $V_{78}$ and $V_{79}$. These voltages are added together in summer 80 to produce an output voltage of $V_{76}+V_{77}+V_{78}+V_{79}$ which is four times the average voltage of the waveform given in FIG. 5. However, if the summer 80 uses an averaging factor of ¼, the required average output is produced.

Figure 4:
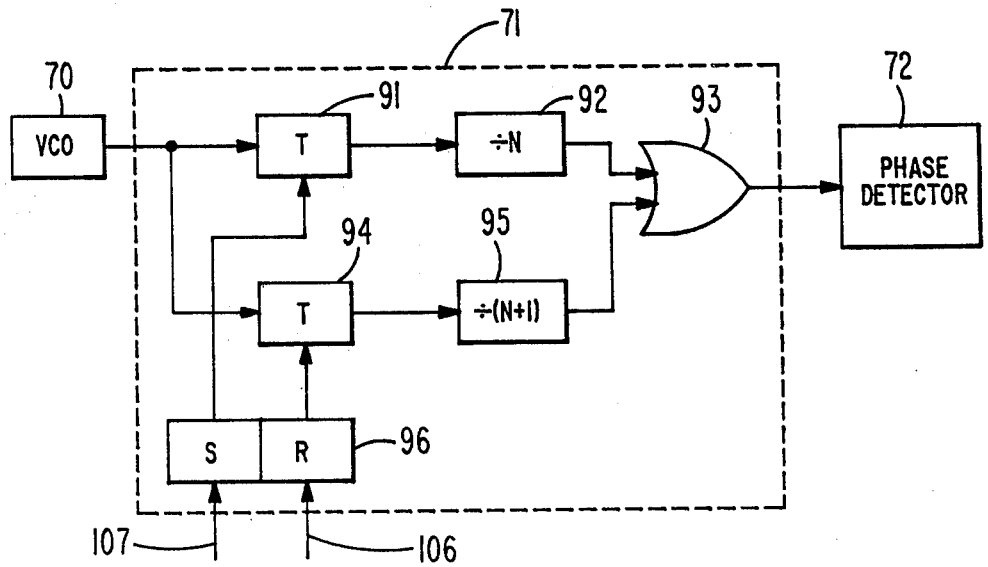
FIG. 4 is a more detailed block diagram of the divider logic which fractionally divides the output of the VCO.

Referring now to FIG. 4, there is shown a more detailed block diagram of the one form of the divider 71 of FIG. 2, which is, in essence, two dividers. In FIG. 4, the output of the VCO 70 is supplied to either divide-by-N divider 92 or divide-by-(N+1) divider 95 through transmission gates 91 and 94, respectively. The transmission gates 91 and 94 are controlled by flip-flop 96 which, in turn, is controlled by signals supplied to input leads 107 and 106 thereof, which, as discussed in connection with FIG. 2, are generated by divider 74 of FIG. 2. The output of the two dividers 92 and 95 are supplied through OR gate 93 to the phase detector 72.

A more detailed diagram of one well-known form of summer 80 is shown in FIG. 7. The summer uses an operational amplifier 180 connected as a voltage summer. The feedback resistor R/4 causes the negative input of the amplifier to be equal to the positive input which is grounded. The current through resistor R/4 is equal to the sum of the currents supplied by input lines 176, 177, 178 and 179. These currents are $V_{76/R}$, $V_{77/R}$, $V_{78/R}$ and $V_{79/R}$, respectively. The output voltage is the sum of these currents multiplied by R/4 as defined by the following expression:

$$E_o = -(V_{76}/R + V_{77}/R + V_{78}/R + V_{79}/R)R/4$$

or $$E_o = -\tfrac{1}{4}(E_1 + E_2 + E_3 + E_4)$$

which is the required average output voltage. If required, the minus sign in the above equation can be removed by using a sum amplifier with a gain of −1.

What is claimed is:

1. In a fractional frequency synthesizer comprising a voltage-controlled oscillator (VCO) for generating an output signal $S_{VCO}$ of frequency $F_{VCO}$, dividing means for dividing $F_{VCO}$ in division cycles with each division cycle consisting of the division of $F_{VCO}$ by N, Y times, and by (N+M), Z times, in an iterative manner to produce a divided output signal $S_N$ of frequency $F_N$, where the division ratio is $$N + M\frac{Z}{Y+Z}$$

and N, Y, M and Z are integers, a reference signal generating means for generating a reference signal $S_R$ of frequency $F_R$, and phase detector means responsive to $S_N$ and $S_R$ to produce an output signal whose amplitude is representative of the phase therebetween; a control circuit comprising:
 means for detecting and averaging the output signals from said phase detector means during each division of $F_{VCO}$ in each division cycle to produce a d.c. control signal whose amplitude is substantially constant and proportional to the average of the amplitudes of the detected output signals over each division cycle;
 said VCO responsive to said d.c. control signal to generate an output signal $S_{VCO}$ whose divided frequency $F_N = F_R$.

2. In a fractional frequency synthesizer comprising a voltage-controlled oscillator (VCO) for generating an output signal $S_{VCO}$ of frequency $F_{VCO}$, dividing means for dividing $F_{VCO}$ in division cycles with each division cycle consisting of the division of $F_{VCO}$ by N, Y times, and by (N+M), Z times, in an iterative manner to produce a divided output signal $S_N$ of frequency $F_N$, and where Y, M and Z are integers, a reference signal generating means for generating a reference signal $S_R$ of frequency $F_R$, and phase detector means responsive to $S_N$ and $S_R$ to produce an output signal whose amplitude is representative of the phase therebetween; a control circuit comprising:
 (Y+Z) sample and hold circuits each responsive, when enabled, to sample and hold the output signal of said phase detector;
 first means responsive to said divided output signal $S_N$ to successively and cyclically enable each of said sample and hold circuits to sample and hold the output signal of said phase detector during one of said divisions; and
 second means for summing and smoothing the contents of said sample and hold circuits each division cycle to produce a control signal of substantially constant amplitude for any given values of N, Y, M and Z;
 said VCO responsive to said control signal to supply an output signal to said dividing means having a substantially constant frequency of a value such that $F_N = F_R$.

3. A fractional frequency synthesizer comprising:
 a voltage-controlled oscillator (VCO) for generating an output signal $S_{VCO}$ of frequency $F_{VCO}$;
 dividing means for dividing $F_{VCO}$ by division cycles with each division cycle consisting of dividing $F_{VCO}$ by N, Y times, and by (N+1), Z times, in an iterative manner to produce a divided output signal $S_N$ of frequency $F_N$, and where Y and Z are integers;

first means for generating a reference signal $S_R$ of frequency $F_R$;

phase detector means responsive to $S_N$ and $S_R$ to produce an output signal whose amplitude is representative of the phase therebetween; and means for detecting and averaging the output signal of said phase detector means during each division of $F_{VCO}$ in each division cycle to produce a d.c. control signal whose amplitude is substantially constant and proportional to the average of the amplitudes of the detected output signals;

said VCO responsive to said d.c. control signal to generate an output signal $S_{VCO}$ whose divided frequency $F_N = F_R$.

4. A fractional frequency synthesizer comprising:

a voltage-controlled oscillator (VCO) for generating an output signal $S_{VCO}$ of frequency $F_{VCO}$;

dividing means for dividing $F_{VCO}$ by division cycles with each division cycle consisting of the division of $F_{VCO}$ by N, Y times, and by (N+1), Z times, in an iterative manner to produce a divided output signal $S_N$ of frequency $F_N$, and where Y and Z are integers;

first means for generating a reference signal $S_R$ of frequency $F_R$;

phase detector means responsive to $S_N$ and $S_R$ to produce an output signal whose amplitude is representative of the phase therebetween;

(Y+Z) sample and hold circuits each responsive, when enabled, to sample and hold the output signal of said phase detector;

second means responsive to said divided output signal $S_N$ to successively and cyclically enable each of said sample and hold circuits to sample and hold the output signal of said phase detector means during one of said divisions; and third means for summing the contents of said sample and hold circuits each division cycle to produce a control signal of substantially constant amplitude for any given values of N, Y and Z;

said VCO responsive to said control signal to supply a substantially constant frequency output signal to said dividing means such that $F_N = F_R$.

5. A fractional frequency synthesizer comprising:

a voltage-controlled oscillator (VCO) for producing an output signal $S_{VCO}$ having a variable frequency $F_{VCO}$;

means for generating first and second control signals;

divider means responsive to said first and second control signals to divide said frequency $F_{VCO}$ by division cycles with each division cycle consisting of dividing by N, Y times, and by (N+1), Z times, in an iterative manner to produce a divided output signal $S_N$ of frequency $F_N$, and where Y and Z are integers;

a reference signal generating means for generating a reference signal $S_R$ having a frequency $F_R$;

phase detector means responsive to said output signal $S_N$ and said reference signal $S_R$ to produce a control signal whose amplitude is representative of the phase therebetween;

a plurality of sample and hold circuits each responsive, when enabled, to sample and hold the output signal of said phase detector means;

commutator means responsive to said divided output signal $S_N$ to successively enable said sample and hold circuits to each sample and hold the output signal of said phase detector during a respective division of each division cycle;

summing means for summing the contents of said sample and hold circuits during each division cycle to produce a substantially constant d.c. output signal; and loop filter means for filtering the output signal of said summing means;

said VCO responsive to said filtered output signal of said summing means to supply a substantially constant frequency output signal to said divider means for any given values of N, Y and Z.

6. In a fractional frequency synthesizer comprising a voltage-controlled oscillator (VCO) for generating an output signal $S_{VCO}$ of frequency $F_{VCO}$, dividing means for the division of $f_{VCO}$ by N, Y times, and by (N+M), Z times, in an iterative manner to produce a divided output signal $S_N$ of frequency $F_N$, and where Y, M and Z are integers, a reference signal generating means for generating a reference signal $S_R$ of frequency $F_R$, and phase detector means responsive to $S_N$ and $S_R$ to produce an output signal whose amplitude is representative of the phase therebetween; a method of removing perturbations from the output of the VCO comprising the steps of:

detecting the output signal of said phase detector means during each division of $F_{VCO}$ in each division cycle;

averaging the amplitudes of said detected output signals to produce a d.c. control signal whose amplitude is substantially constant and proportional to the average of the amplitudes of said detected output signals; and supplying said d.c. control signal to said VCO to cause the VCO to produce an output signal of a substantially constant frequency $F_{VCO}$ such that $F_N = F_R$.

7. In a fractional frequency synthesizer comprising a voltage-controlled oscillator (VCO) for generating an output signal $S_{VCO}$ of frequency $F_{VCO}$, dividing means for the division of $F_{VCO}$ by N, Y times, and by (N+M), Z times, in an iterative manner to produce a divided output signal $S_N$ of frequency $F_N$, and where Y, M and Z are integers, a reference signal generating means for generating a reference signal $S_R$ of frequency $F_R$, and phase detector means responsive to $S_N$ and $S_R$ to produce an output signal whose amplitude is representative of the phase therebetween; a method of removing perturbations from the output of the VCO comprising the steps of:

sampling and holding the output signal of said phase detector means during each division of each division cycle;

summing and averaging the amplitudes of said samplings to produce a d.c. control signal whose amplitude is constant and proportional to the average of the amplitudes of said samplings; and supplying said d.c. control signal to said VCO to cause the VCO to produce an output signal of a constant frequency $F_{VCO}$ such that $F_N = F_R$.

* * * * *